United States Patent
Endo et al.

(10) Patent No.: US 9,665,018 B2
(45) Date of Patent: May 30, 2017

(54) MEASURING APPARATUS, MEASURING METHOD, LITHOGRAPHY APPARATUS, AND ARTICLE MANUFACTURING METHOD

(71) Applicant: CANON KABUSHIKI KAISHA, Tokyo (JP)

(72) Inventors: Masatoshi Endo, Utsunomiya (JP); Takanori Morooka, Saitama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 220 days.

(21) Appl. No.: 14/523,652

(22) Filed: Oct. 24, 2014

(65) Prior Publication Data

US 2015/0116688 A1 Apr. 30, 2015

(30) Foreign Application Priority Data

Oct. 31, 2013 (JP) ................. 2013-227241

(51) Int. Cl.
| | | |
|---|---|---|
| *G01B 11/00* | (2006.01) | |
| *G03B 27/32* | (2006.01) | |
| *G03F 9/00* | (2006.01) | |
| *G03F 7/20* | (2006.01) | |

(52) U.S. Cl.
CPC ........ *G03F 9/7046* (2013.01); *G03F 7/70616* (2013.01); *G03F 7/70633* (2013.01); *G03F 9/7003* (2013.01)

(58) Field of Classification Search
CPC .... G03F 7/70616; G03F 7/70633; G03F 9/70; G03F 9/7003; G03F 9/7046
USPC ............. 355/67, 68, 72, 77; 356/399–401
See application file for complete search history.

(56) References Cited

U.S. PATENT DOCUMENTS

| | | | | |
|---|---|---|---|---|
| 4,881,100 A | * | 11/1989 | Nakai | G03F 9/7046 250/548 |
| 5,805,866 A | * | 9/1998 | Magome | G03F 7/70858 355/53 |
| 7,817,242 B2 | | 10/2010 | Kawakubo et al. | |

(Continued)

FOREIGN PATENT DOCUMENTS

| | | |
|---|---|---|
| EP | 1348149 B1 | 8/2005 |
| EP | 1596425 A1 | 11/2005 |

(Continued)

*Primary Examiner* — Colin Kreutzer
(74) *Attorney, Agent, or Firm* — Canon U.S.A., Inc. IP Division

(57) ABSTRACT

A measuring apparatus measures a position of each of shot regions formed on a substrate. The apparatus includes a detector configured to detect a mark formed with respect to a shot region on the substrate, and a processor configured to obtain a position of each of the shot regions based on an output of the detector. The processor is configured to obtain a coefficient of a regression equation for obtaining a position of each of the shot regions, based on an output of the detector with respect to each of a plurality of sample shot regions on the substrate, and obtain, if the coefficient satisfies a tolerable condition for a discrepancy between the coefficient and a reference value thereof, the position of each of the shot regions using each offset amount that is obtained beforehand to correct the position of each of the shot regions obtained based on the regression equation.

15 Claims, 20 Drawing Sheets

(56) References Cited

U.S. PATENT DOCUMENTS

| | | | |
|---|---|---|---|
| 2004/0101984 A1* | 5/2004 | Heine | G03F 7/70633 |
| | | | 438/16 |
| 2005/0025352 A1* | 2/2005 | Suzuki | H01L 21/67259 |
| | | | 382/151 |
| 2007/0109524 A1 | 5/2007 | Kawakubo et al. | |
| 2008/0221709 A1 | 9/2008 | Ishii et al. | |
| 2014/0229134 A1* | 8/2014 | Han | G06F 17/18 |
| | | | 702/81 |

FOREIGN PATENT DOCUMENTS

| | | |
|---|---|---|
| EP | 1731968 A2 | 12/2006 |
| JP | 2003-86483 A | 3/2003 |
| WO | 2005/053007 A1 | 6/2005 |

* cited by examiner

REFERENCE TABLE

| Wafer 1 | 2013_0821_L001_wafer_1 |
| Wafer 2 | 2013_0821_L001_wafer_2 |
| Wafer 3 | 2013_0821_L001_wafer_3 |
| Wafer 4 | 2013_0821_L001_wafer_4 |
| Wafer ... | ... |
| Wafer N | 2013_0821_L001_wafer_N |

80
81

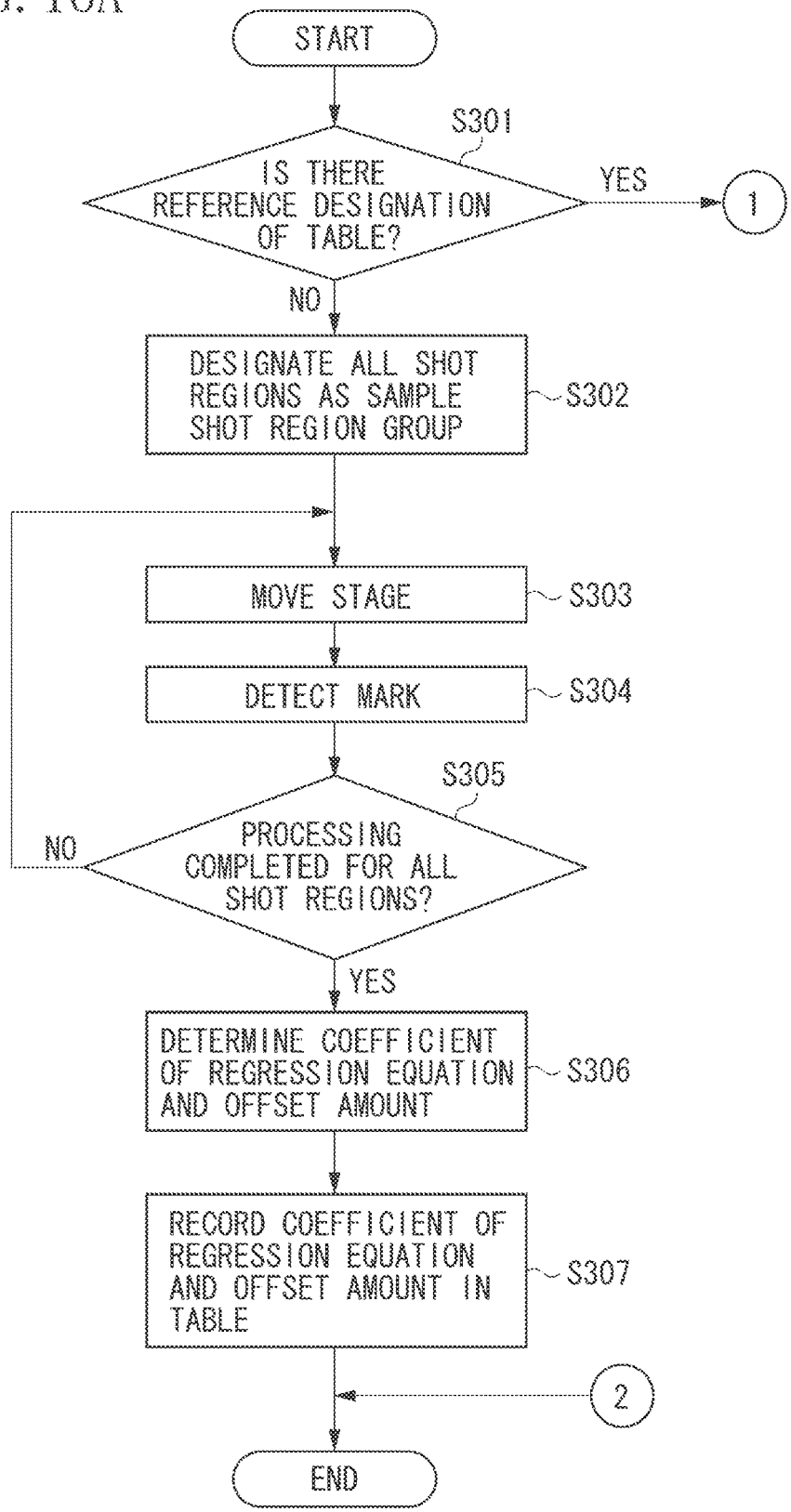

MEASURING APPARATUS, MEASURING METHOD, LITHOGRAPHY APPARATUS, AND ARTICLE MANUFACTURING METHOD

BACKGROUND OF THE INVENTION

Field of the Invention

The present disclosure generally relates to measuring and, more particularly, to a measuring apparatus, measuring method, lithography apparatus, article manufacturing method, and to a technique for measuring positions of shot regions formed on a substrate.

Description of the Related Art

To manufacture a device (an article) such as a semiconductor device, a lithography apparatus (e.g., an exposure apparatus) forms a pattern (a latent image pattern in a resist or a pattern of the resist) on a substrate. As the pattern to be formed becomes finer, the lithography apparatus needs to measure the position of the pattern on the substrate with higher accuracy, to superimpose the pattern on a pattern (a shot region) that has been already formed on the substrate.

In conventional measurement, an apparatus measures a position of partial shot region groups (sample shot region groups) of shot regions that have already been formed on a substrate, and determines a coefficient of a linear regression equation for the measured position. This regression equation is a linear (simple) equation for a position (X and Y coordinates) in design of each shot. Further, as for a leading substrate in the same lot, the apparatus determines an offset amount relative to a position of each shot obtained by this regression equation, and creates a table of this offset amount. To determine this offset amount, the apparatus measures shot regions except the sample shot region group. This table is used for other substrates included in the same lot, to omit measurement of shot regions except the sample shot region, so that overlay precision becomes compatible with throughput (see Japanese Patent Application Laid-Open No. 2003-086483).

Further, as for other substrates included in the same lot, there is a known method to determine if there is a need for updating the table based on a variation amount of the offset amount, and to update the table when there is such a need (International Publication WO2005/053007).

Manufacturing a device includes a lamination process of extracting a layer of a substrate formed through a lithography process, and laminating this layer with a different substrate such as a glass substrate. The substrate that has undergone such a lamination process may be further subjected to a lithography process. A pattern (a shot region) on the layer laminated with the different substrate in this laminating process may have large deformation. Therefore, the sample shot region group may include a shot region having deformation. In this case, the method of Japanese Patent Application Laid-Open No. 2003-086483 cannot achieve overlay within a tolerance, regardless of whether it is appropriate to apply the offset amount of the table, even if a pattern is formed based on the position of each shot region determined from the obtained regression equation. In addition, it is difficult to increase reproducibility of extraction or lamination of the substrate and therefore, the coefficient of the above-described regression equation may greatly vary depending on the substrate in the same lot. For this reason, when the method of International Publication WO2005/053007 is applied, the table is frequently updated, which is disadvantageous in terms of throughput of the lithography apparatus.

SUMMARY OF THE INVENTION

The present disclosure is directed to, for example, a technique that is advantageous in terms of compatibility between overlay precision and throughput.

According to an aspect of the present disclosure, a measuring apparatus for measuring a position of each of a plurality of shot regions formed on a substrate, includes a detector configured to detect a mark formed with respect to a shot region on the substrate, and a processor configured to obtain a position of each of the plurality of shot regions based on an output of the detector, wherein the processor is configured to obtain a coefficient of a regression equation for obtaining a position of each of the plurality of shot regions, based on an output of the detector with respect to each of a plurality of sample shot regions on the substrate, and obtain, if the coefficient satisfies a tolerable condition for a discrepancy between the coefficient and a reference value thereof, the position of each of the plurality of shot regions using each offset amount that is obtained beforehand to correct the position of each of the plurality of shot regions obtained based on the regression equation.

Further features of the present disclosure will become apparent from the following description of exemplary embodiments with reference to the attached drawings.

BRIEF DESCRIPTION OF THE DRAWINGS

FIG. 8 is a diagram illustrating an example of a UI used to designate a table including offset amounts.

FIG. 14 is a diagram illustrating an example of a UI in a state in which a table is designated.

FIGS. 16A and 16B are flow charts illustrating another example of the flow of the alignment measurement processing (step S102 in FIG. 10).

DESCRIPTION OF THE EMBODIMENTS

Figure 1:
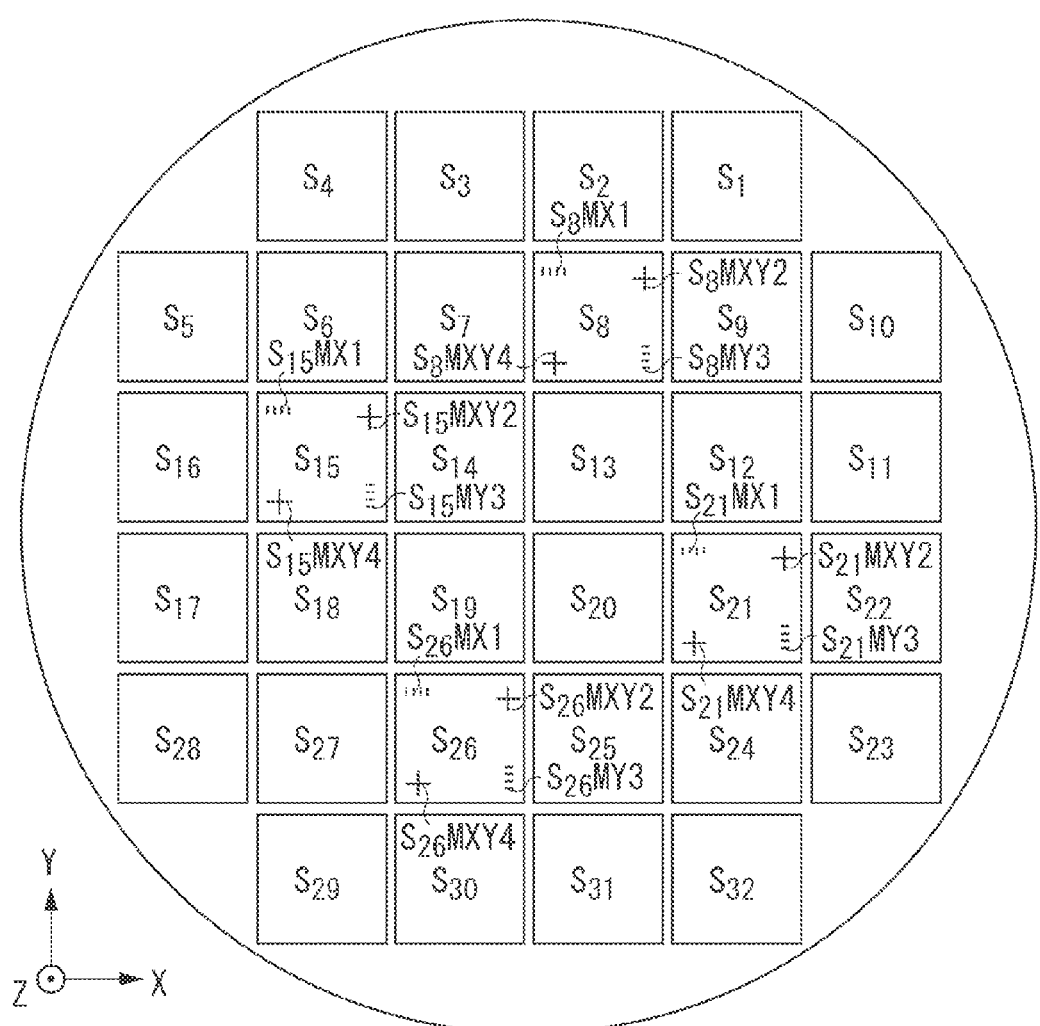
FIG. 1 is a diagram illustrating examples of each shot region and a sample shot region group on a substrate.
Figure 2:
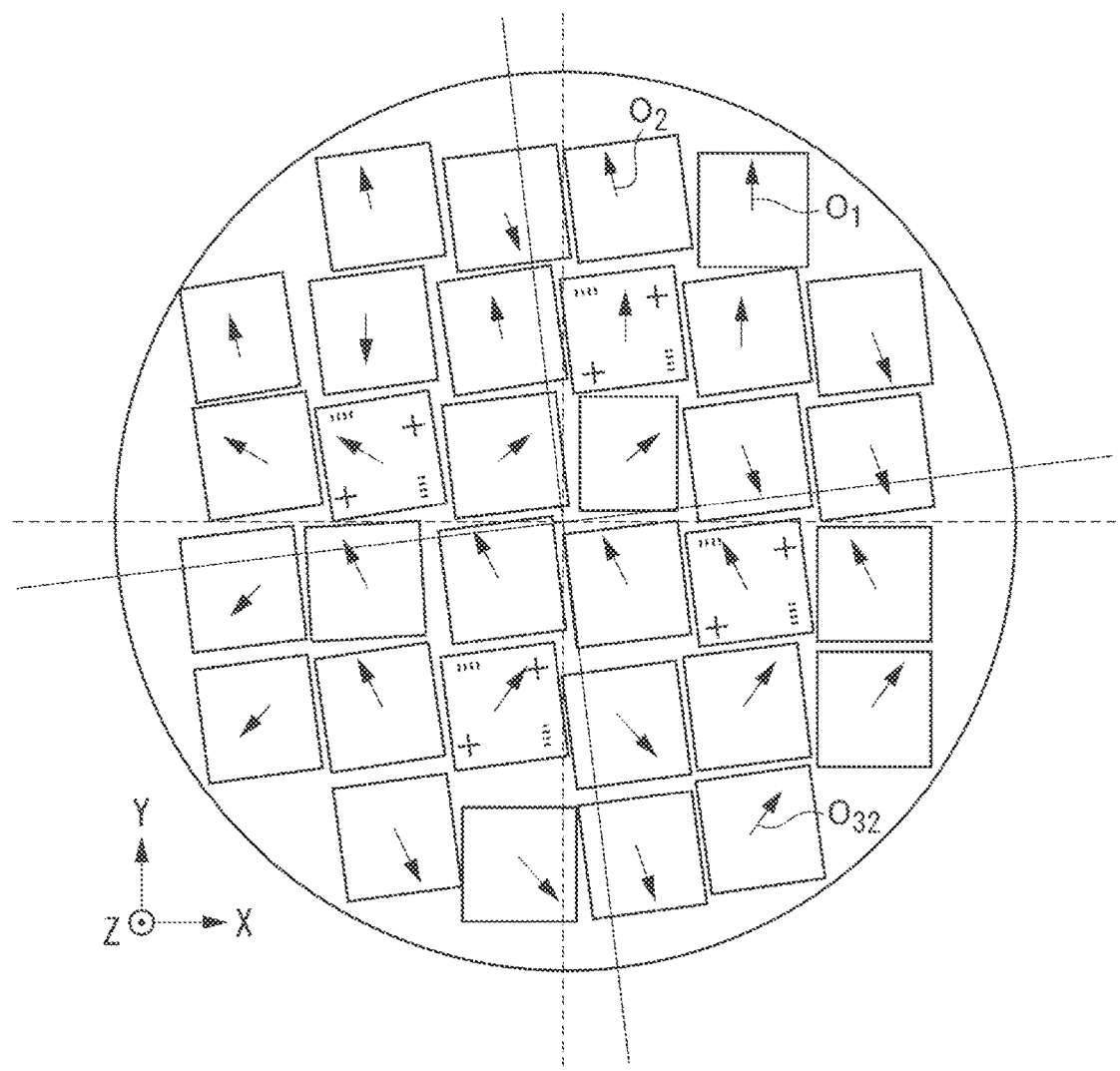
FIG. 2 is a diagram illustrating an example of an offset amount of each shot region.

Various exemplary embodiments, features, and aspects of the disclosure will be described in detail below with reference to the drawings.

A first exemplary embodiment of the present disclosure will be described below. Basically, unless otherwise specified, the same members are provided with the same reference numeral and redundant description thereof will be omitted.

Figure 6:
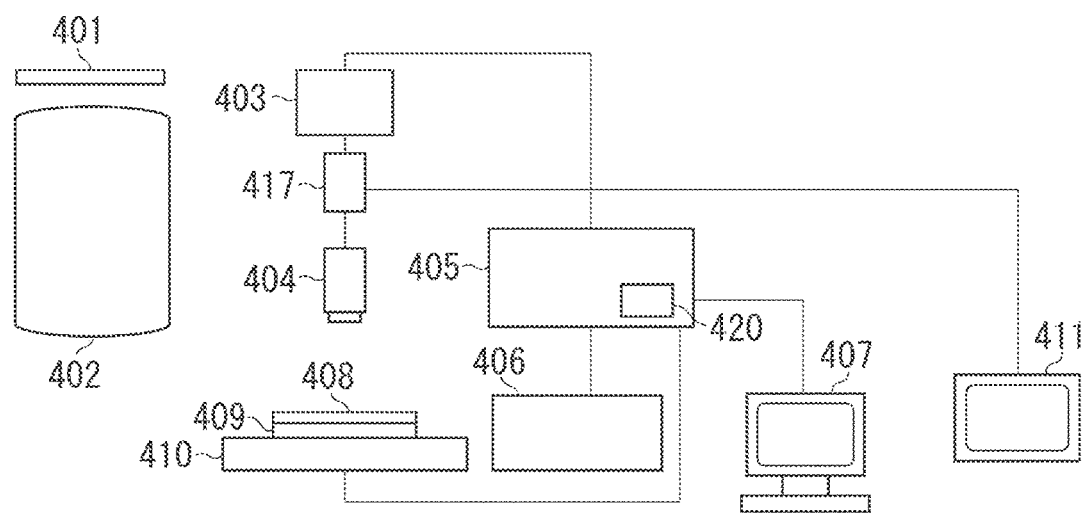
FIG. 6 is a diagram illustrating a configuration example of an exposure apparatus.

First, a configuration example of an exposure apparatus serving as a lithography apparatus according to an exemplary embodiment will be described with reference to FIG. 6. Here, this exposure apparatus may form a pattern on a substrate, using ultraviolet light, vacuum-ultraviolet light, or extreme ultraviolet light. As illustrated in FIG. 6, the exposure apparatus uses a reticle 401 and a substrate 408. A chuck 409 is provided to hold the substrate 408, and a stage 410 is provided to hold the chuck 409 and move the substrate 408. A projection optical system 402 is provided to project light from the reticle 401 onto the substrate 408. A microscope 404 is provided to detect a mark formed on the substrate 408. An image capture unit 417 (e.g., a charge-coupled device (CCD) camera) is provided to convert an image of the mark obtained through the microscope 404 into an electrical signal. An image arithmetic unit 403 performs arithmetic processing on the electrical signal (an image signal) obtained from the image capture unit 417, and stores the image signal and an arithmetic processing result. Further, a pre-alignment unit 406 is provided to position the substrate 408 carried in by a substrate conveyance unit (not illustrated) based on an external form of the substrate 408. A console unit 407 (a computer terminal) is provided to function as a user interface (UI). A monitor 411 is provided to serve as a display unit allowing a user to confirm the image obtained through the microscope 404. A control unit (may also be referred as "processor") 405 is provided to control each part described above. The control unit 405 includes a storage unit 420 and a central processing unit (CPU). The control unit 405 may be configured to be able to communicate with a host computer present outside the exposure apparatus. The microscope 404 and the image capture unit 417 are used to configure a detector. They are an off-axis-type detector that detects a mark without using the projection optical system 402, however, they may detect a mark through the projection optical system 402. Further, the reticle 401 can be precisely positioned relative to the projection optical system 402 by a known method. Furthermore, it is assumed that the position of an optical axis of the microscope 404 relative to an optical axis of the projection optical system 402 (a relative positional relationship between these optical axes, a so-called base line) has been already measured. In FIG. 6, components except the reticle 401, the projection optical system 402, and the substrate 408 may be used to configure a measuring unit (a measuring apparatus) according to an exemplary embodiment. As used herein, the term "unit" generally refers to any combination of software, firmware, hardware, or other component that is used to effectuate a purpose.

Figure 5A:
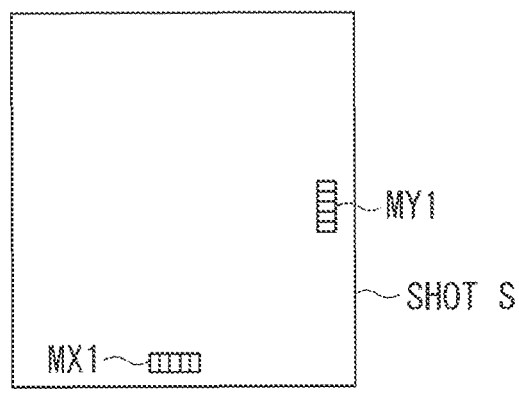
FIGS. 5A, 5B, and 5C are diagrams illustrating an example of each alignment mark to be used in alignment measurement.
Figure 5B:
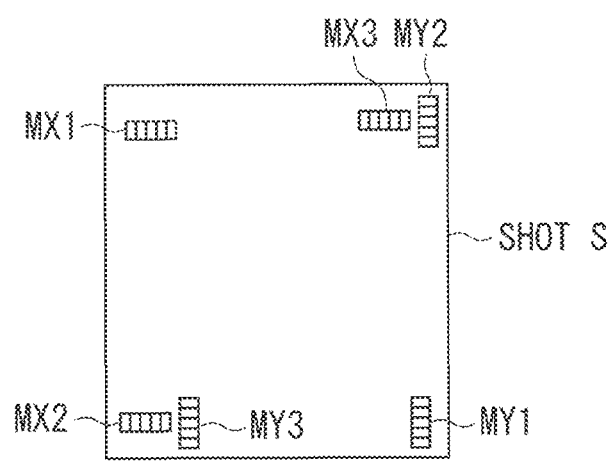
Figure 5C:
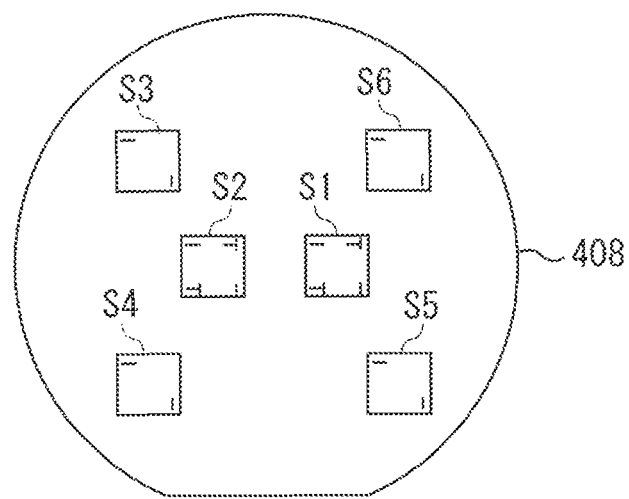
Figure 10:
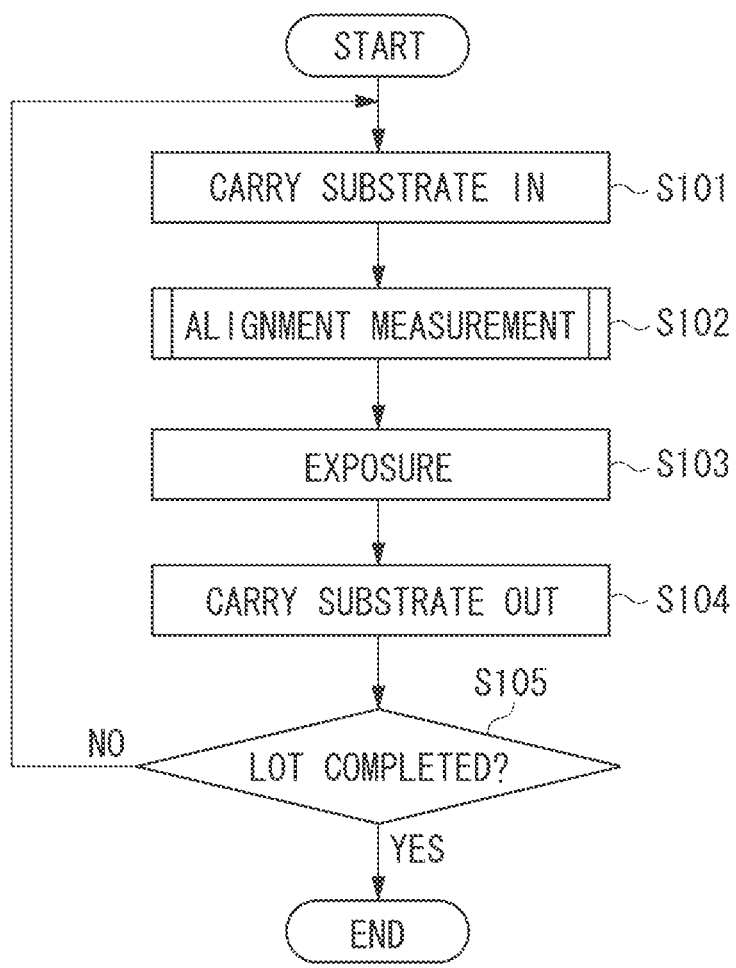
FIG. 10 is a diagram illustrating an example of a flow of operation of the exposure apparatus.
Figure 11A:
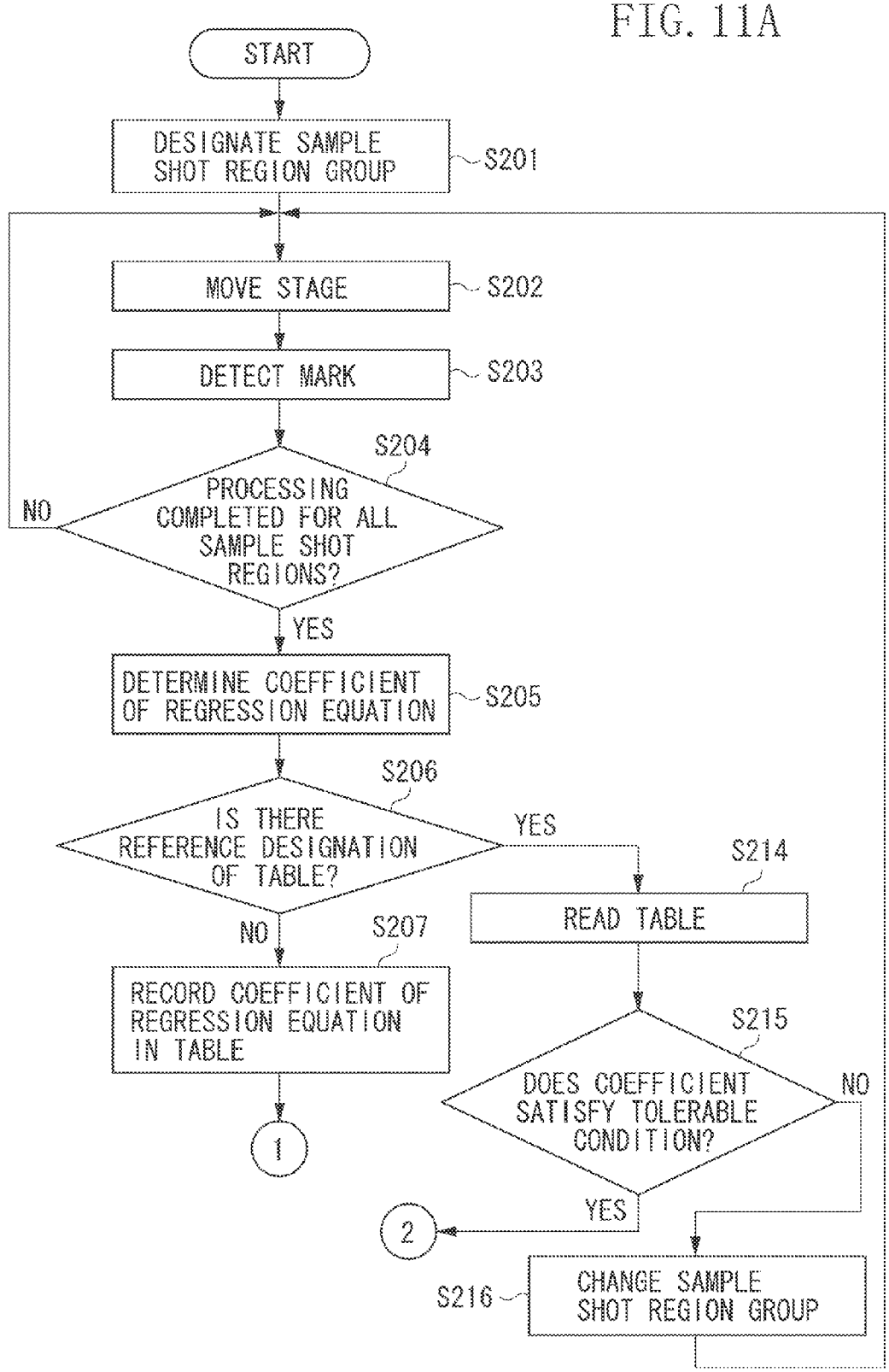
FIGS. 11A and 11B are flow charts illustrating an example of a flow of alignment measurement processing (step S102 in FIG. 10).
Figure 11B:
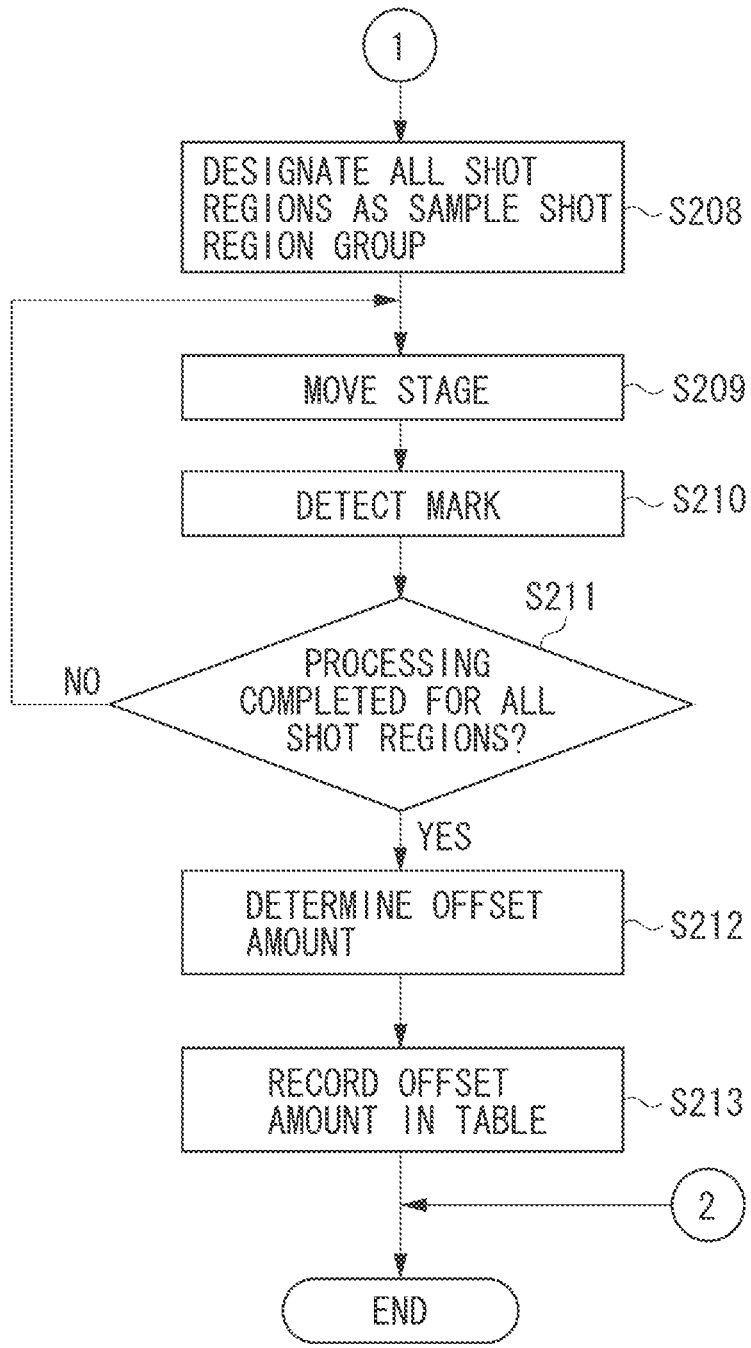

As illustrated in FIG. 5C, shot regions Si (i=1 to n) which are overlay exposure target are formed on the substrate 408. Further, as illustrated in FIG. 5A, (alignment) marks MX1 and MY1 are formed for each of the shot regions Si. A positional deviation (a deviation amount from a position in design) of the shot region Si can be detected by detecting these marks. Furthermore, as illustrated in FIG. 5B, in some cases, multiple marks MXi and MYi may be formed for one shot region Si. An index (a coefficient) indicating the shape (such as magnification) or rotation of the shot region Si can be determined by detecting the marks MXi and MYi more than one XY pair. Usually, exposure processing is performed for each lot including two or more of the substrates 408. FIGS. 10, 11A and 11B are diagrams (flowcharts) illustrating examples of a flow of operation of the exposure apparatus. The control unit 405 controls each part, by performing an operation according to a program corresponding to these flowcharts.

Figure 7:
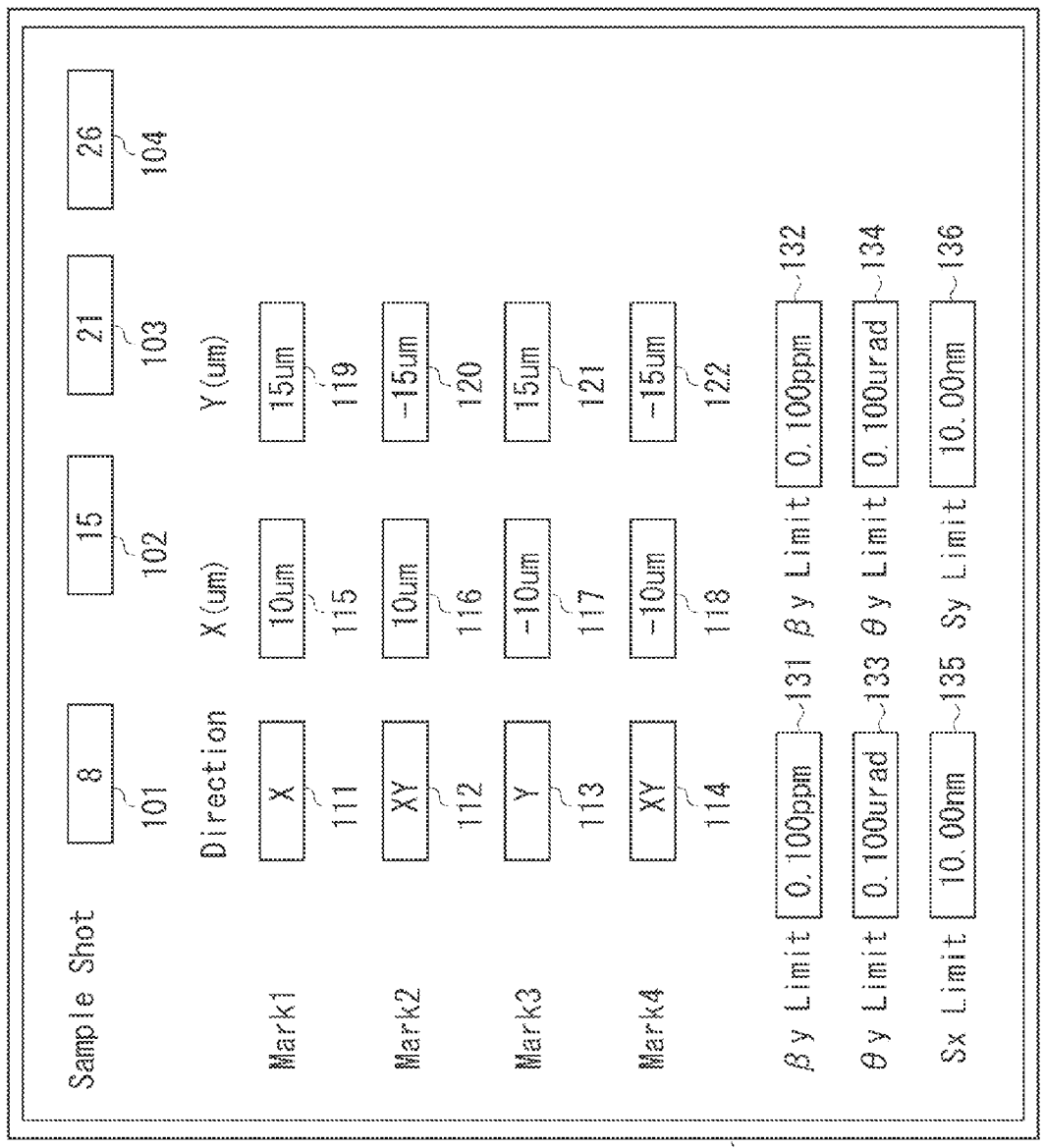
FIG. 7 is a diagram illustrating an example of a user interface (UI) used to designate measurement conditions.

FIG. 7 illustrates a screen 100 displayed on a monitor of the console unit 407. Here, input regions 101 to 104 are illustrated. The input regions 101 to 104 are each provided for the user to designate the number of a sample shot region that is necessary to determine a regression equation that expresses the position of each shot region on the substrate 408, based on so-called global alignment measurement. In FIG. 7, shot regions 8, 15, 21, and 26 are designated by the user. Further, input regions 111 to 122 are provided for the user to designate a type (a measurement direction) and coordinates of each measurement target mark. The types of the alignment marks are XY mark, X mark, and Y mark. The XY mark allows acquisition of positional deviations in both of an X direction and a Y direction by one-time detection. The X mark and the Y mark allow acquisition of a positional deviation in the X direction and a positional deviation in the Y direction, respectively. The input regions 111 and 114 are each provided for the user to designate the type of the mark. The input regions 115 to 118 are provided for the user to designate the X coordinate, as design of the mark, and the input regions 119 to 122 are provided for the user to designate the Y coordinate, as design of the mark. Here, Mark 1 is an X mark located at a position (X, Y)=(10 mm, 15 mm) as a designed position with an origin point at the center of the shot region Si. Mark 3 is a Y mark. Mark 2 and Mark 4 are XY marks.

Here, FIG. 1 illustrates a sample shot region group and marks on the substrate 408 in the global alignment measurement performed according to information designated by the user through the console unit 407 (the screen 100). The size and arrangement of each shot region may also be set by the user through the console unit 407. In FIG. 1, the marks are illustrated only for the shot regions 8, 15, 21, and 26. However, typically, the marks are present for all the shot regions 1 to 32. The marks measured according to the flowcharts in FIGS. 10 and 11 are the marks designated in the input regions 111 to 122 by the user.

Returning back to FIG. 7, the description will be continued. As illustrated in FIG. 7, input regions 131 to 136 are provided for the user to designate thresholds to be described below. The input regions 131 and 132 are provided for magnification coefficients $\beta x$ and $\beta y$, respectively, of a regression equation. The input regions 133 and 134 are provided for rotation coefficients ex and ey, respectively, of the regression equation. The input regions 135 and 136 are provided for translation coefficients Sx and Sy, respectively, of the regression equation. Here, 0.100 ppm is set as a threshold for the magnification coefficients, 0.100 µrad is set as a threshold for the rotation coefficients, and 10 nm is set as a threshold for the translation coefficients. The thresholds may be set automatically or by a user, based on overlay precision. Each of the thresholds may be a positive value, if the threshold corresponds to an absolute value of a discrepancy between a coefficient and a standard value thereof (e.g., a coefficient in the head substrate 408 of a lot).

Figure 8:
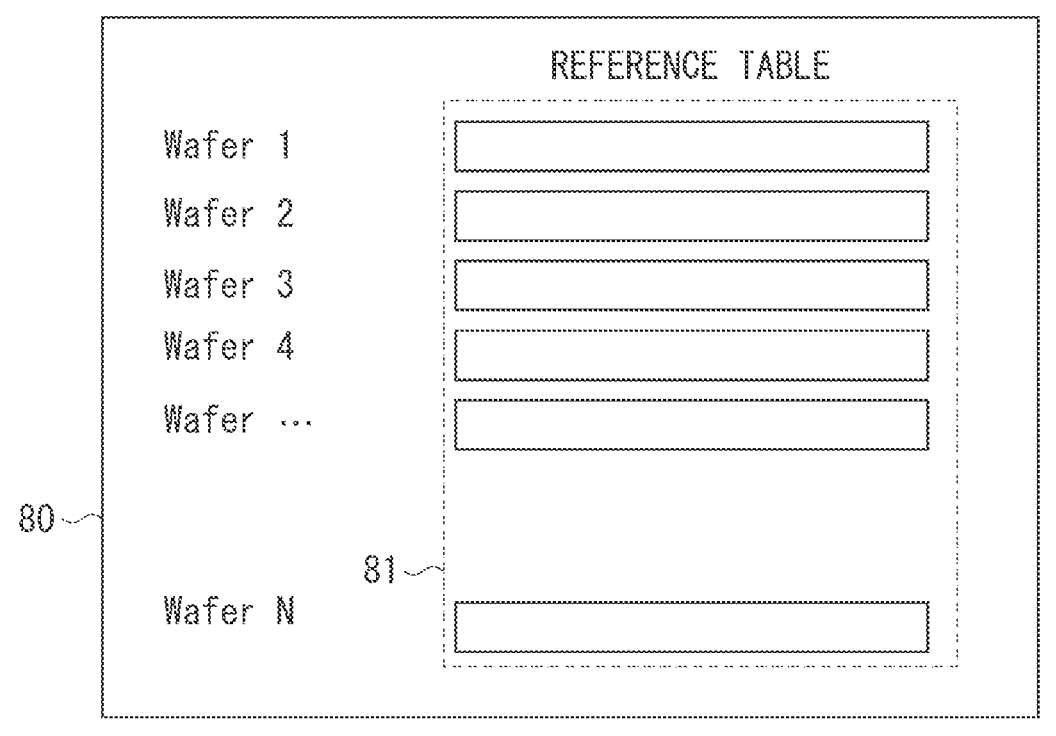

FIG. 8 is a diagram illustrating an example of a UI provided for the user to designate a table (may also be referred to as "correction table") including offset amounts. A screen 80 is provided in the monitor of the console unit 407 for the user to designate a table to be used for the substrate 408 of the relevant lot. The user can designate the table for each of the substrates 408. The user designates the table by inputting, in an input region 81, character information used to identify the table. The information input by the user through the input regions in FIGS. 7 and 8 is stored in the storage unit 420 in the control unit 405.

Figure 9:
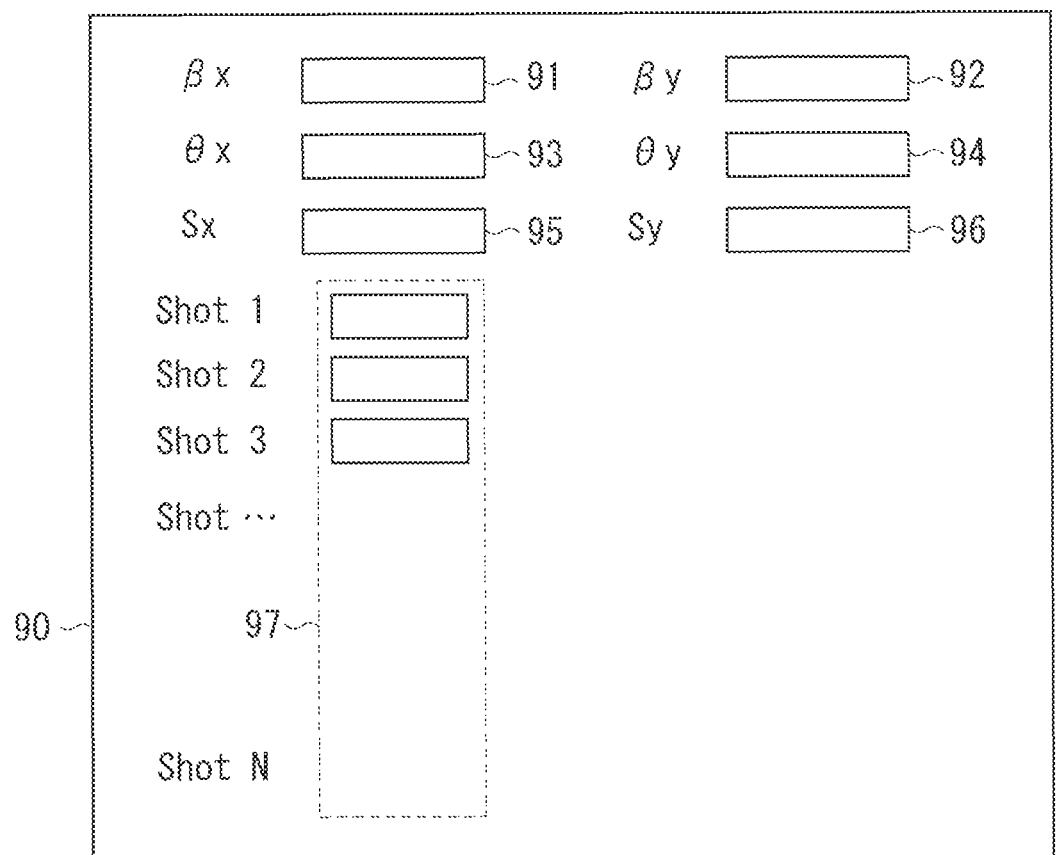
FIG. 9 is a diagram illustrating an example of content of a table including offset amounts.

FIG. 9 is a diagram illustrating an example of the content of a table 90 including offset amounts. The table 90 may be in a file format, or may be held in memory space in the storage unit 420. Here, it is assumed that the table 90 is in a file format. The table 90 has regions 91 to 96 for holding the coefficients of the regression equation obtained by the global alignment measurement. In other words, the table 90 has the regions 91 and 92 for the magnification coefficients βx and βy, respectively; the regions 93 and 94 for the rotation coefficients θx and θy, respectively; and the regions 95 and 96 for the translation coefficients Sx and Sy, respectively. Further, the table 90 has a region 97 for holding an offset amount (Oi) of each shot region.

Here, FIG. 10 is a diagram illustrating an example of a flow of operation of the exposure apparatus, and FIGS. 11A and 11B are flow charts illustrating an example of a flow of alignment measurement processing (step S102 in FIG. 10). A flow of operation of the measuring apparatus according to an exemplary embodiment as well as the exposure apparatus including this measuring apparatus will be described with reference to FIGS. 10, 11A and 11B.

When the flowchart of FIG. 10 begins (when processing for each lot begins), first, in step S101, the substrate conveyance unit (not illustrated) carries the substrate 408 in so that the stage 410 holds the substrate 408.

In step S102, the measuring unit performs the alignment measurement processing. The flowcharts of FIGS. 11A and 11B illustrate the flow of operation in step S102. When the flowchart of FIG. 11A begins, first, in step S201, the control unit 405 calls the designated information described above with reference to FIG. 7, from the storage unit 420, and sets a mark for the designated sample shot region (a sample shot region group) as a detection target. In the case of FIG. 7, marks for the sample shot regions 8, 15, 21, and 26 are set as the detection targets.

In step S202, the control unit 405 drives the stage 410 so that a mark S8MX1 for the sample shot region 8 comes in a field of view of the microscope 404. Next, in step S203, the detector detects the mark. Here, the microscope 404 and the image capture unit 417 takes an image of the mark S8MX1 illuminated by an illumination unit (not illustrated), as an image signal (image information). The control unit 405 performs matching (template matching) between this image information and template information stored in the image arithmetic unit 403, and determines a deviation amount of the position of the mark S8MX1 from a designed position. The deviation amount is stored in the image arithmetic unit 403, as a positional deviation of the sample shot region 8.

In step S204, the control unit 405 determines whether the measurement processing is completed for all the sample shot regions. When there is a sample shot region yet to be processed (No in step S204), the processing returns to step S202. When there is no sample shot region yet to be processed (Yes in step S204), the processing proceeds to step S205. In this way, the positional deviations in the X and Y directions are obtained for every sample shot region set beforehand.

When the measurement is completed for all the sample shot regions, in step S205, the control unit 405 determines a regression equation for determining the position of each shot region, based on an output of the detector. Here, a position in each designed shot region is di=[dxi, dyi]$^T$, and a position of the sample shot region obtained by the mark detection is ai=[axi, ayi]$^T$. Further, a regression error is ei=[exi, eyi]$^T$, and a regression position (a position obtained by the regression equation) is gi=[gxi, gyi]$^T$=[axi+exi, ayi+eyi]$^T$. Then, for example, the following mathematical expression (1) can be used as the regression equation.

$$gi = B\theta d_i + S \quad (1)$$

The control unit 405 determines "B", "Θ", and "S" to minimize a sum of squares of the regression error "ei". In other words, the control unit 405 determines "B", "θ", and "S" to minimize in the following mathematical expression (2). This may be performed, for example, using a least squares method.

$$V = \frac{1}{n}\sum |e_i|^2$$

(where i=1, 2, . . . , n; n is the number of sample shot regions) (2)

"B", "Θ", and "S" in the mathematical expression (1) may be expressed by the following mathematical expression (3).

$$B = \begin{pmatrix} 1+\beta_x & 0 \\ 0 & 1+\beta_y \end{pmatrix}, \Theta = \begin{pmatrix} \cos\theta_y & -\sin\theta_y \\ \sin\theta_x & \cos\theta_x \end{pmatrix}, S = \begin{pmatrix} s_x \\ s_y \end{pmatrix} \quad (3)$$

In the mathematical expression (3), "βx" and "βy" represent a magnification coefficient in an x-axis direction and a magnification coefficient in a y-axis direction, respectively. Further, "θx" and "θy" represent a rotation coefficient in the x-axis direction and a rotation coefficient in the y-axis direction, respectively. Further, "Sx" and "Sy" represent a translation coefficient in the x-axis direction and a translation coefficient in the y-axis direction, respectively.

Next, in step S206, the control unit 405 determines whether there is reference designation of a table for the substrate 408, based on information in the memory region 420. When there is no such reference designation (No in step S206), the processing proceeds to step S207. When there is such reference designation (Yes in step S206), the processing proceeds to step S214.

Figure 12:
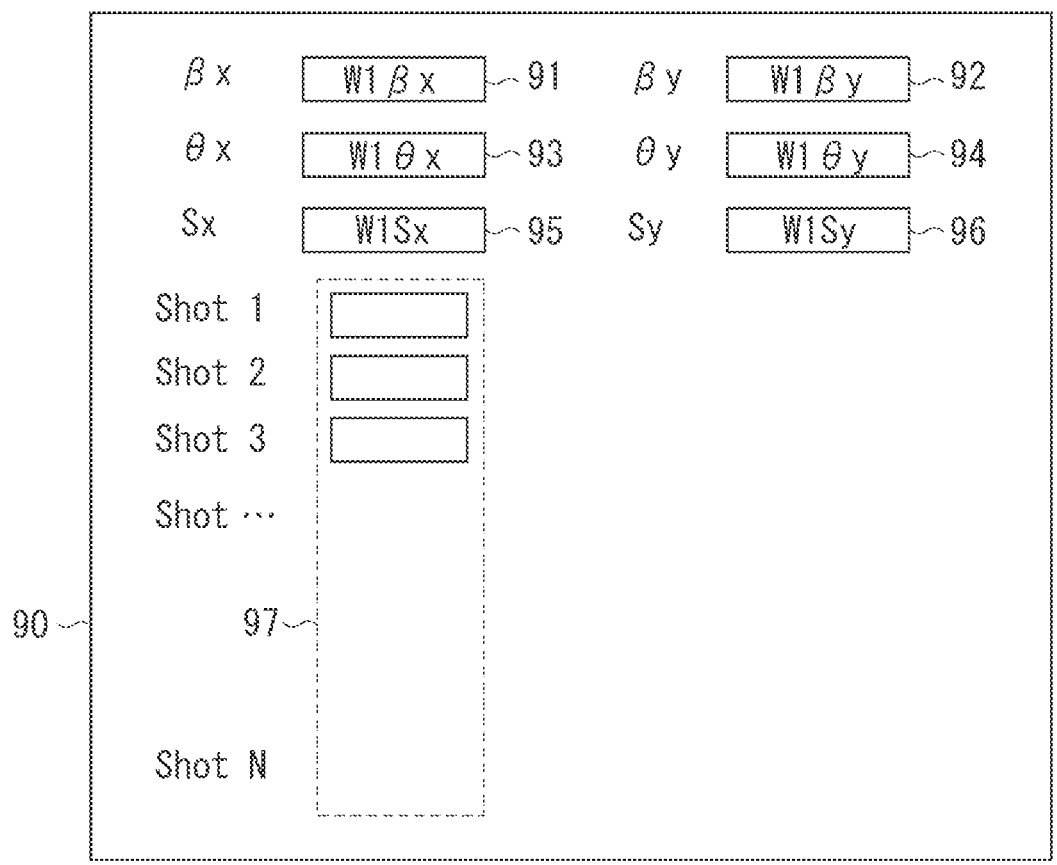
FIG. 12 is a diagram illustrating an example of content of a table in which coefficients of a regression equation are recorded.

Typically, there is no reference designation of a table for the head substrate 408 in a lot in the first overlay exposure. Therefore, the processing proceeds to step S207 in which the coefficients of the regression equation determined in step S205 are recorded in the table 90. The recorded coefficients are provided with reference numerals W1βx, W1βy, W1θx, W1θy, W1Sx, and W1Sy, as distinguished from the coefficients in the mathematical expression (3). FIG. 12 illustrates an example of the content of this table (file) 90.

Next, in step S208, all the shot regions are set as shot regions (a sample shot region group) targeted for measurement. Subsequently, in step S209 and step S210, the detector detects a mark for one of the shot regions in a manner similar to step S202 and step S203. The detection of the mark in step S209 and step S210 is performed based on the position of the shot region obtained by the regression equation determined in step S205. In step S211, the control unit 405 determines whether the processing in step S209 and step S210 has been performed for all the shot regions. When there is a shot region yet to be processed (No in step S211), the processing returns to step S209. When there is no shot region yet to be processed (Yes in step S211), the processing proceeds to step S212.

In step S212, the control unit 405 determines an offset amount (Oi) for the position of each shot region, based on an output of the detector. This offset amount may be, for example, a discrepancy between a position of each shot region obtained based on a newly determined regression equation in the form of the mathematical expression (1), and a position of each shot region obtained based on the previous regression equation.

Figure 13:
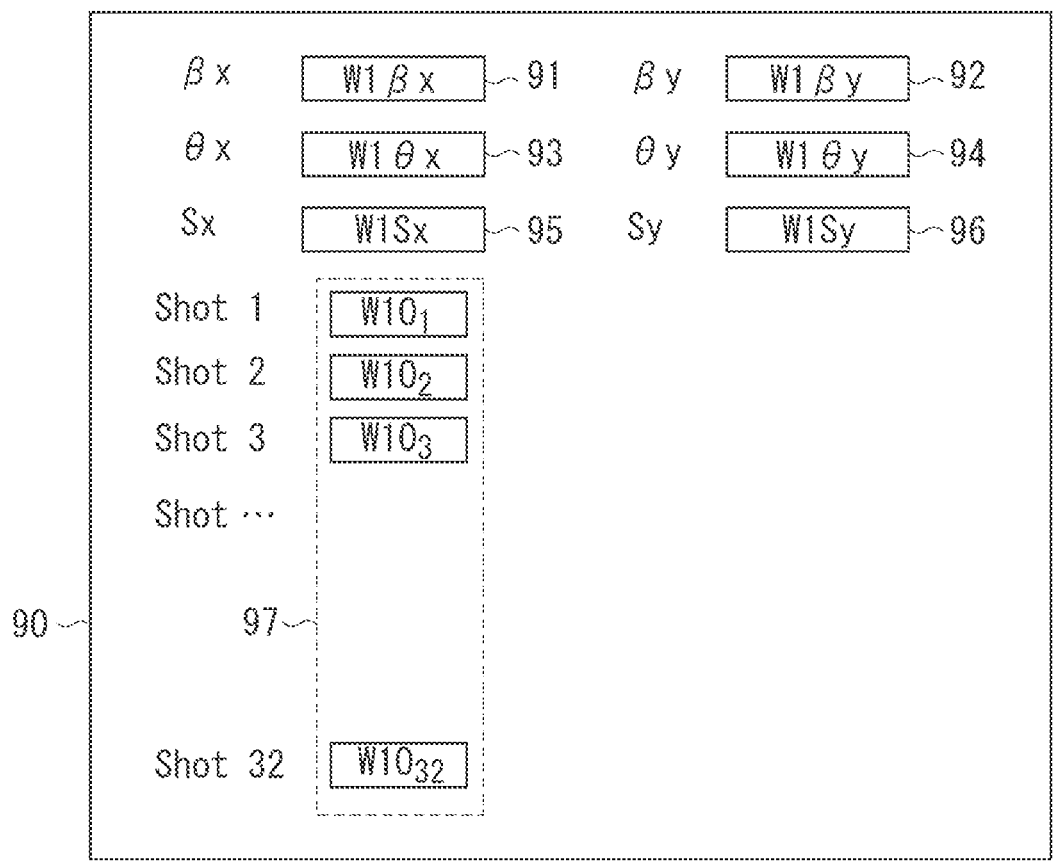
FIG. 13 is a diagram illustrating an example of content of the table in which the coefficients of the regression equation and offset amounts are recorded.

In step S213, the control unit 405 records, in the table 90, the offset amount (Oi) of each shot region determined in step S212. FIG. 13 illustrates the content of this table (file) 90. Upon completion of step S213, the processing proceeds to step S103 in the flowchart of FIG. 10. In step S103, the exposure apparatus performs the exposure processing on each shot region, based on the position of each shot region obtained using the coefficients of the regression equation and the offset amount that are determined in step S102. Here, the position of the ith shot region (Si) is expressed by the following mathematical expression (4).

$$gi = Ad_1 + S + 0_i, \text{ (where } dA = B\Theta\text{)} \quad (4)$$

When the exposure is completed for all the shot regions, the processing proceeds to step S104 in which the substrate conveyance unit carries the substrate 408 out. Next, in step S105, the control unit 405 determines whether the exposure is completed for all the substrates in the target lot. When there is a substrate yet to be processed (No in step S105), the processing returns to step S101. When there is no substrate yet to be processed (Yes in step S105), the processing ends.

Next, there will be described a flow of processing when there is reference designation of a table "m" as illustrated in FIG. 14. In FIG. 14, the table 90 illustrated in FIG. 13 is designated for the head substrate (a wafer 1) of the lot, by using a character string "2013_0821_L001_wafer_1". Upon start of the flowchart in FIG. 10, in step S101, the substrate conveyance unit carries the substrate in. In step S102, the processing in the flowchart of FIGS. 11A and 11B begins. At this moment, information in the table (file) is absent (the state illustrated in FIG. 9). As described above, in step S201 to step S204, the mark detection for the sample shot regions (the shot regions 8, 15, 21, and 26) is completed. In step S205, coefficients W1βx', W1βy', W1θx', W1θy', W1Sx', and W1Sy' of a regression equation are determined.

Next, in step S206, there is the reference designation of the table and therefore, the processing proceeds to step S214. In step S214, the control unit 405 reads the table 90 designated for reference (i.e. reads the table 90 designated as illustrated in FIG. 13), from the storage unit 420. The table 90 may be read from a host computer (not illustrated). Next, in step S215, the control unit 405 makes a comparison between the coefficients of the regression equation in the table 90 designated for reference, and the coefficients of the regression equation newly determined in step S205, to obtain a discrepancy therebetween. Based on a result of this comparison, the control unit 405 determines whether the absolute value of the discrepancy does not exceed the threshold input through the UI of FIG. 7 (i.e., whether the discrepancy is within a tolerance or satisfies a tolerable condition).

Assume that newly determined magnification coefficients, rotation coefficients, and translation coefficients are βx', βy', θx', θy', Sx', and Sy', and the magnification coefficients, rotation coefficients, and translation coefficients recorded in the table 90 are βx, βy, θx, θy, Sx, and Sy. Then, the tolerable conditions (the tolerance) to be satisfied by the respective coefficients are expressed by the following mathematical expressions (5) to (10). A term "*Limit" (such as "βxLimit") on the right side represents each threshold (set value) input through the UI of FIG. 7. Each of the tolerable conditions expressed by the mathematical expressions (5) to (10) is only an example. The tolerable condition may be, for example, a condition using an index indicating the degree of the discrepancy between each of the newly determined coefficients and each of the coefficients (the standard value or set value) recorded in the table. Moreover, this tolerable condition is not limited to those mentioned above, and may be variously altered or modified.

$$|\beta x' - \beta x| \leq \beta x \text{Limit} \quad (5)$$

$$|\beta y' - \beta y| \leq \beta y \text{Limit} \quad (6)$$

$$|\Theta x' - \Theta x| \leq \Theta x \text{Limit} \quad (7)$$

$$|\Theta x' - \Theta x| \leq \Theta y \text{Limit} \quad (8)$$

$$|Sx' - Sx| \leq Sx \text{Limit} \quad (9)$$

$$|Sy' - Sy| \leq Sy \text{Limit} \quad (10)$$

When the mathematical expressions (5) to (10) are satisfied, the control unit 405 determines that there will be no problem in terms of overlay precision in a case where the coefficients W1βx', W1βy', W1θx', W1θy', W1Sx', and W1Sy' are used in combination with the offset amounts in the table. In this case, the processing in the flowcharts of FIGS. 11A and 11B ends. The processing then proceeds to step S103 in the flowchart of FIG. 10. In step S103, the exposure processing on each shot region is performed using the coefficients W1βx', W1βy', W1θx', W1θy', W1Sx', and W1Sy' determined in step S205 as well as the offset amount in the table.

When the mathematical expressions (5) to (10) are not satisfied, the control unit 405 determines that there will be a problem in terms of overlay precision in a case where the coefficients W1βx', W1βy', W1θx', W1θy', W1Sx', and W1Sy' are used in combination with the offset amount in the table. In this case, the processing proceeds to step S216. In step S216, the control unit 405 changes the sample shot regions (the sample shot region group). The control unit 405 then performs the processing from step S202 to step S205 again so that coefficients of a new regression equation are obtained. Here, an algorithm for changing the sample shot region group may change (replace) at least one sample shot region to (with) a shot region adjacent thereto.

Figure 3:
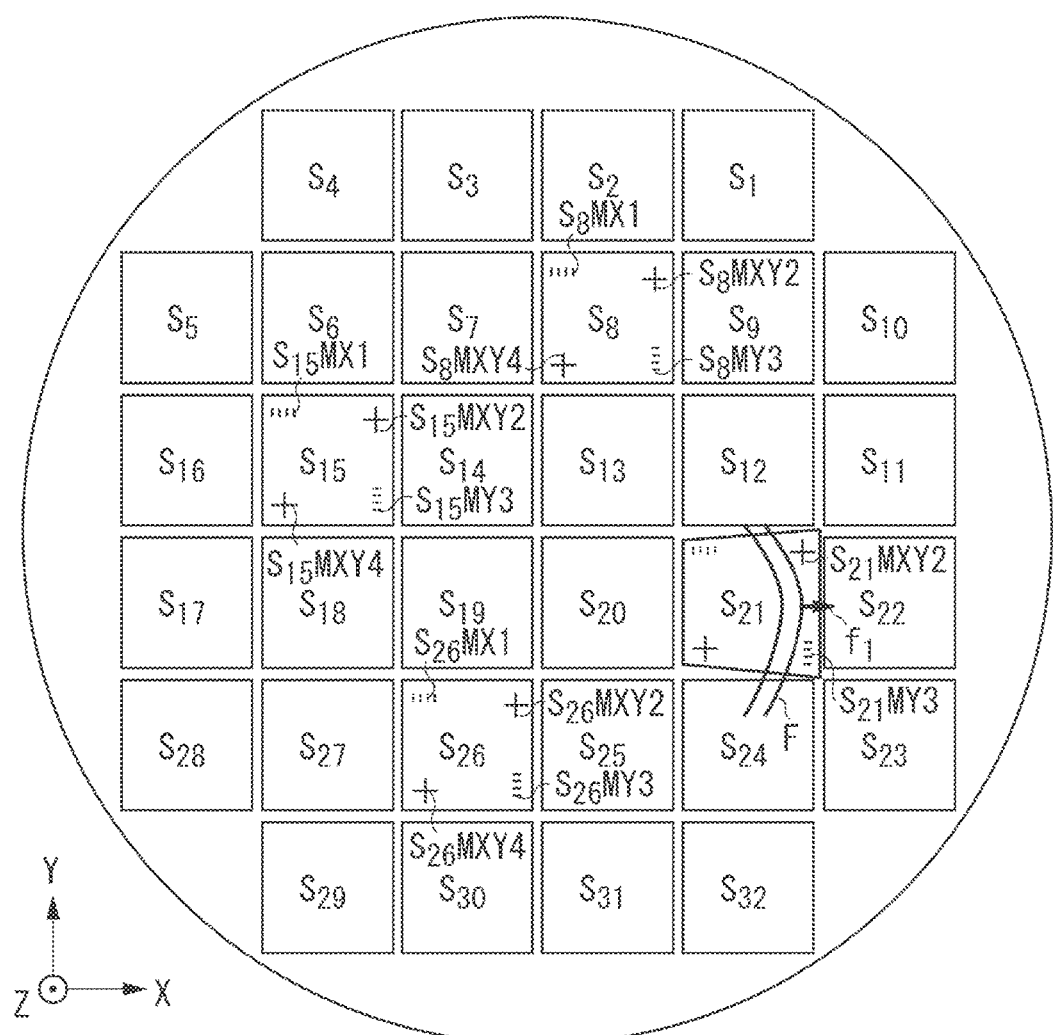
FIG. 3 is a diagram illustrating an example of local deformation of a layer (a shot region) on a substrate.
Figure 4:
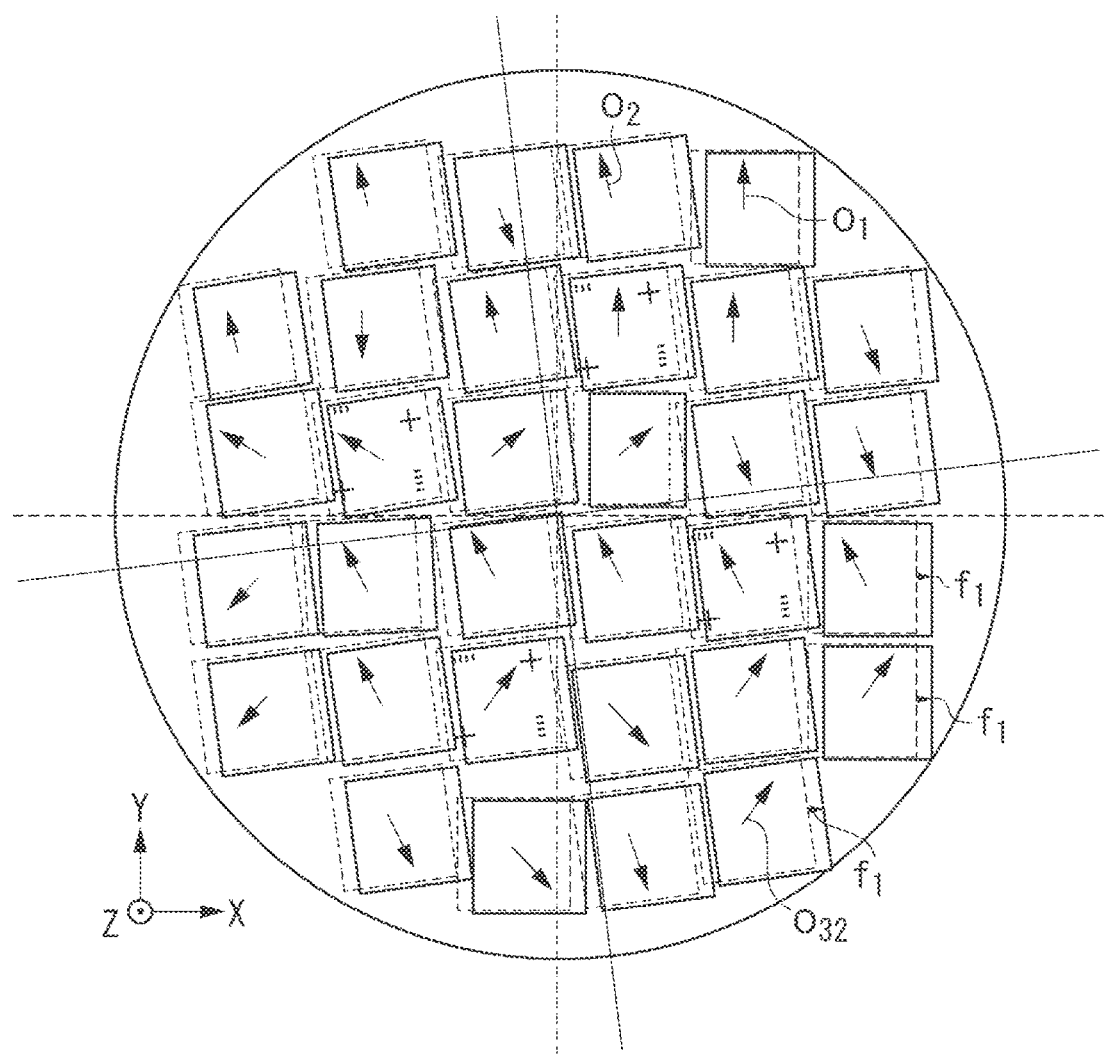
FIG. 4 is a diagram illustrating an example of a position of each shot region obtained by measuring a sample shot region affected by the deformation.

For example, assume that a local deformation F (a positional deviation of the shot region S21: f1) occurs as illustrated in FIG. 3, due to a laminating process like the one described earlier. In this case, for example, the absolute value of the discrepancy between the coefficient W1βx' and the coefficient W1βx in the table may exceed the threshold (βxLimit=0.100 ppm) (i.e., may not satisfy the expression (5)). Here, FIG. 4 is a diagram illustrating an example of the position of each shot region obtained from the detection of the sample shot region affected by the deformation. This indicates that an overlay error attributable to the positional deviation fl may occur. In that case, the sample shot region group is changed and the processing (from step S202 to step S215) is repeated. The change of the sample shot region group is performed, for example, by changing (replacing) the shot region 8 to (with) the shot region 13, the shot region 15 to the shot region 14, the shot region 21 to the shot region 21, and the shot region 26 to the shot region 19. Then, the influence of the deformation F illustrated in FIG. 3 can be reduced. Therefore, the absolute value of the discrepancy between the new coefficient $W1\beta x'$ and the coefficient $W1\beta x$ in the table may be prevented from exceeding the threshold ($\beta x$Limit=0.100 ppm) (the expression (5) may be satisfied). Then, the control unit 405 determines that there will be no problem in terms of accuracy in step S215, and proceeds to the exposure processing (step S103).

Figure 15:
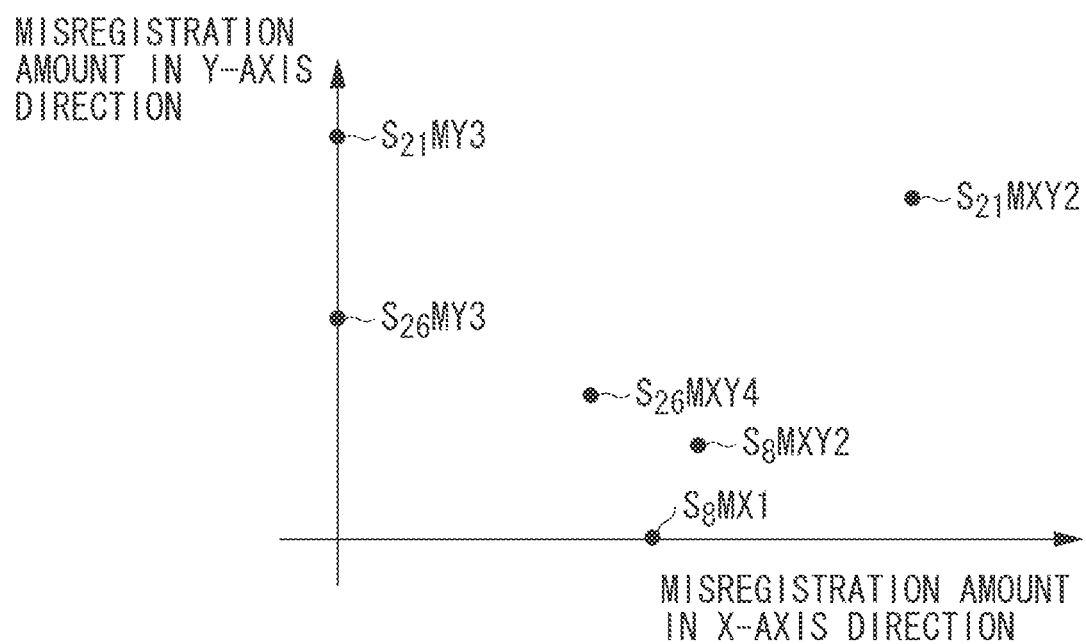
FIG. 15 is a diagram used to describe a method for identifying a mark showing a large measurement error.

As the algorithm for changing the sample shot region group, the method of changing (replacing) each shot region to (with) the adjacent shot region may be employed as described above. However, there is also a method of changing only a shot region related to a mark with a largest positional deviation obtained in step S205. FIG. 15 illustrates a deviation amount of each mark. For example, a mark S26MXY4 has a deviation amount in the X-axis direction and a deviation amount in the Y-axis direction. The larger the deviation amount in the X-axis direction is, the further rightward the mark is located. The larger the deviation amount in the Y-axis direction is, the further upward the mark is located. In the example of FIG. 15, the deviation amount (the distance from the origin) of a mark S21MXY2 is the largest and therefore, the sample shot region 21 is taken as a change target. Other sample shot regions are not targeted for change.

There is a case where the tolerable condition may not be satisfied by changing the sample shot region only once. In such a case, in step S216, the control unit 405 changes the sample shot region group again. The control unit 405 may count the number of times the control unit 405 has determined that the tolerable condition is not satisfied in step S215 (the number of times the processing has proceeded to step S216). When this number of times reaches an upper limit (e.g., three times) (i.e., when a termination condition is satisfied), the processing may be once stopped to request the user to designate subsequent processing content. In this case, the subsequent processing may include changing of the table, proceeding to step S103 while maintaining the current table, and proceeding to step S104 in which the exposure processing is to be cancelled (namely, carrying out of the substrate). In any case, it is possible to perform processing according to determination by the user.

According to the present exemplary embodiment, the frequency of updating the table can be reduced. Therefore, it is possible to provide a technique that is advantageous in that overlay precision is compatible with throughput.

A second exemplary embodiment will be described with reference to the flowchart of FIG. 10 and a flowchart of FIG. 16.

The processing in the flowchart of FIG. 10 except the processing in step S102 has been described above and therefore will not be described. The processing in step S102 will be described with reference to the flowcharts of FIGS. 16A and 16B. In step S301, in a manner similar to step S206, the control unit 405 determines whether there is reference designation of a table for the conveyed substrate 408, based on the information in the memory region 420. When there is such reference designation (Yes in step S301), the processing proceeds to step S308. When there is no such reference designation (No in step S301), the processing proceeds to step S302. When there is no reference designation, the control unit 405 sets all the shot regions as detection targets in step S302. The processing from step S303 to step S305 is similar to the processing from step S202 to step S204, except there is a discrepancy in terms of target sample shot region. In step S306, the control unit 405 determines coefficients of a regression equation and offset amounts, based on an output (information about a detected mark) of the detector. How to determine these coefficients and offset amounts is in principle similar to that in the first exemplary embodiment. However, these coefficients and offset amounts are determined based on results of the detection in all the shot regions designated in step S302, which is a point different from the first exemplary embodiment. In step S307, the coefficients of the regression equation and the offset amounts determined in step S306 are saved in a table 90. FIG. 13 illustrates the content of the table 90 obtained in step S307. Here, the content of the table 90 is stored in the storage unit 420.

Figure 16B:
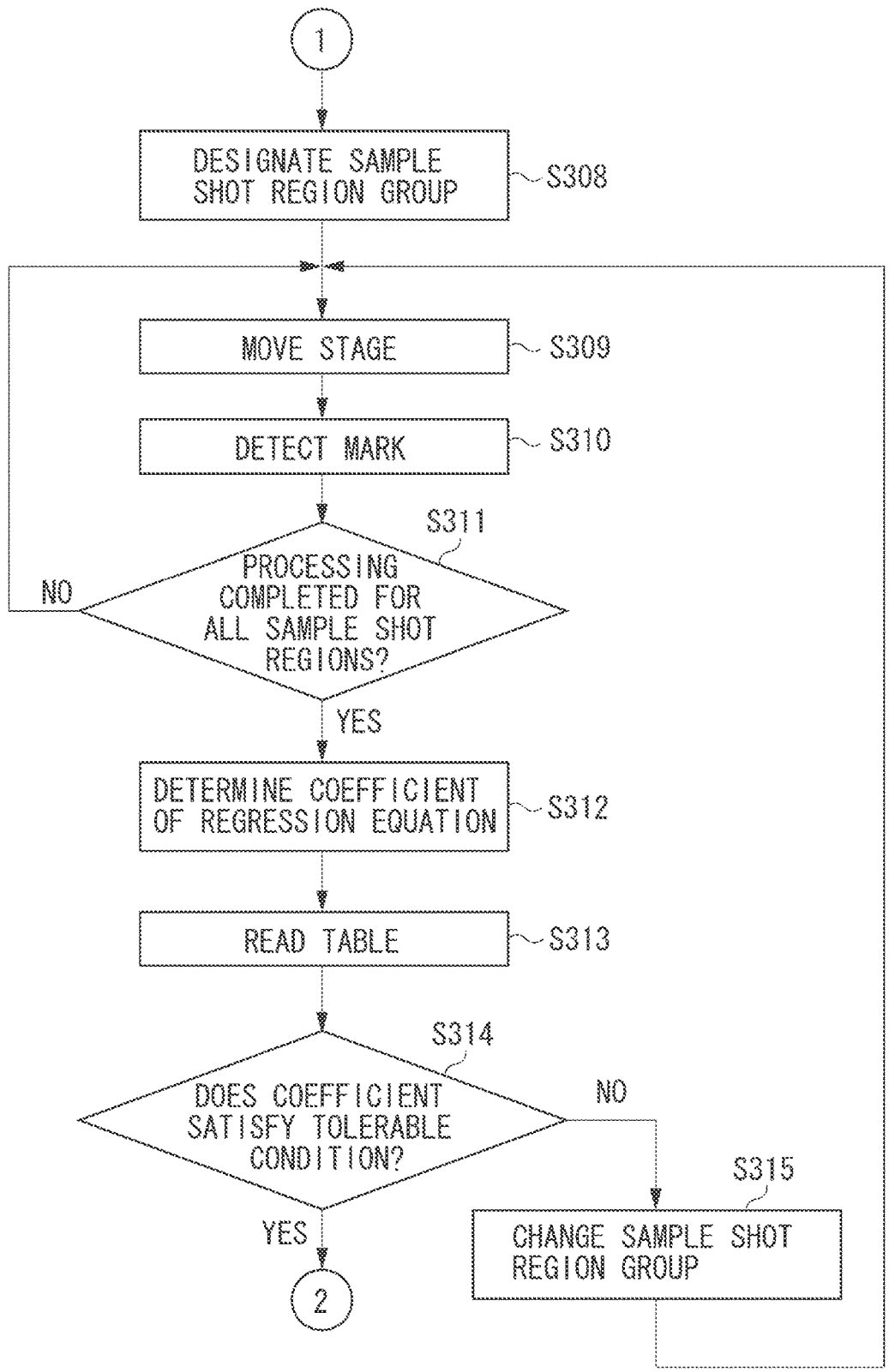

After step S307, the flowcharts of FIGS. 16A and 16B end and the processing returns to step S103 in the flowchart of FIG. 10. In step S103, the exposure processing of each shot region is performed according to the content of the table 90 saved in step S307. Upon completion of the exposure for all the shot regions, the processing proceeds to step S105 in which the substrate conveyance unit carries the substrate 408 out. In step S105, the control unit 405 determines whether all the substrates in the target lot are processed. When there is a substrate yet to be processed (No in step S105), the processing returns to step S101. When there is no substrate yet to be processed (Yes in step S105), the processing ends.

Figure 17:
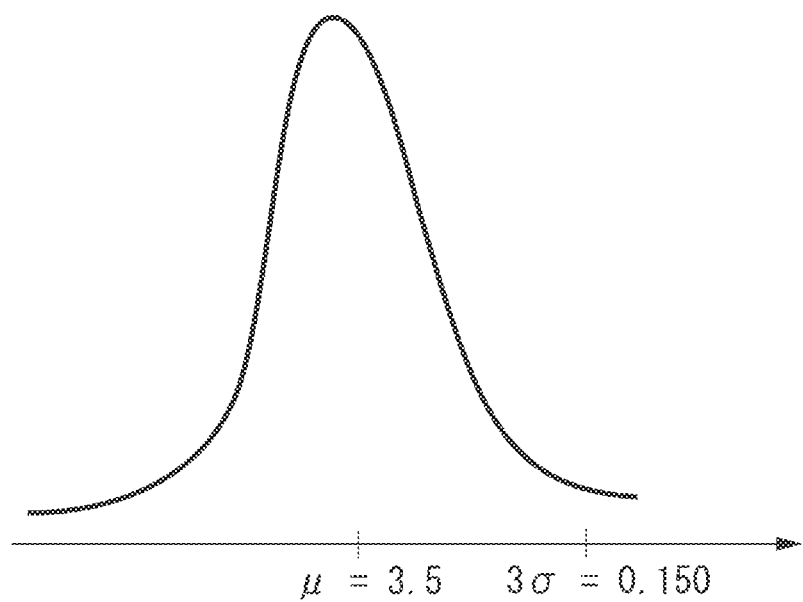
FIG. 17 is a diagram illustrating an example of frequency distribution of a coefficient of a regression equation.

When terminating the processing based on the determination in step S105, the control unit 405 reads the coefficients of the regression equation of each substrate saved in step S307 from the storage unit 420, and determines a standard deviation of each of the coefficients. As an example, FIG. 17 illustrates frequency distribution (a histogram) of the magnification coefficient $\beta x$. A $\beta x$ standard deviation "$\sigma$" obtained from this histogram is tripled (namely, 3 $\sigma$) and 0.150 ("$\mu$" is a mean value of $\beta x$) is obtained. Here, 0.150 is automatically designated as a threshold of the magnification coefficient $\beta x$ illustrated in FIG. 7. Thresholds for other coefficients can also be automatically designated in a similar manner.

Next, the processing after the table is designated for reference as illustrated in FIG. 14 will be described with reference to the flowcharts of FIGS. 10, 16A and 16B. The processing in the flowchart of FIG. 10 is performed in the manner as described above, and the processing in step S102 is performed according to the flowcharts of FIGS. 16A and 16B. In step S301, the control unit 405 determines that there is reference designation of the table, and the processing proceeds to step S308. In step S308, the control unit 405 sets a sample shot region. In processing from S309 to step S311, the detector detects a mark related to the sample shot region set in step S308. In step S312, the control unit 405 determines coefficients of a regression equation based on an output (information about the detected mark) of the detector. In step S313, the control unit 405 reads the information in the table from the storage unit 420. In step S314, the control unit 405 operates in a manner similar to step S215 of the first exemplary embodiment. Specifically, the control unit 405 determines whether coefficients related to a target substrate satisfy tolerable conditions, based on the coefficients in the table designated for reference and coefficients of a newly determined regression equation as well as the thresholds in FIG. 7. The thresholds used here are those automatically set as described above. When the tolerable conditions are not satisfied (No in step S314), the control unit 405 changes the sample shot region group in step S315, and then repeats the processing from step S309 to step S314. When the tolerable conditions are satisfied (Yes in step S314), the flowchart of FIG. 16 ends, and the processing then proceeds to step S103 in the flowchart of FIG. 10. In step S103, the exposure processing for each shot region is performed using the coefficients of the regression equation determined in step S312 and the offset amounts (the processing in step S103 is performed in the manner described above). A condition for terminating the loop executed when the tolerable conditions are not satisfied can be similar to the condition described above with reference to step S216.

Figure 18:
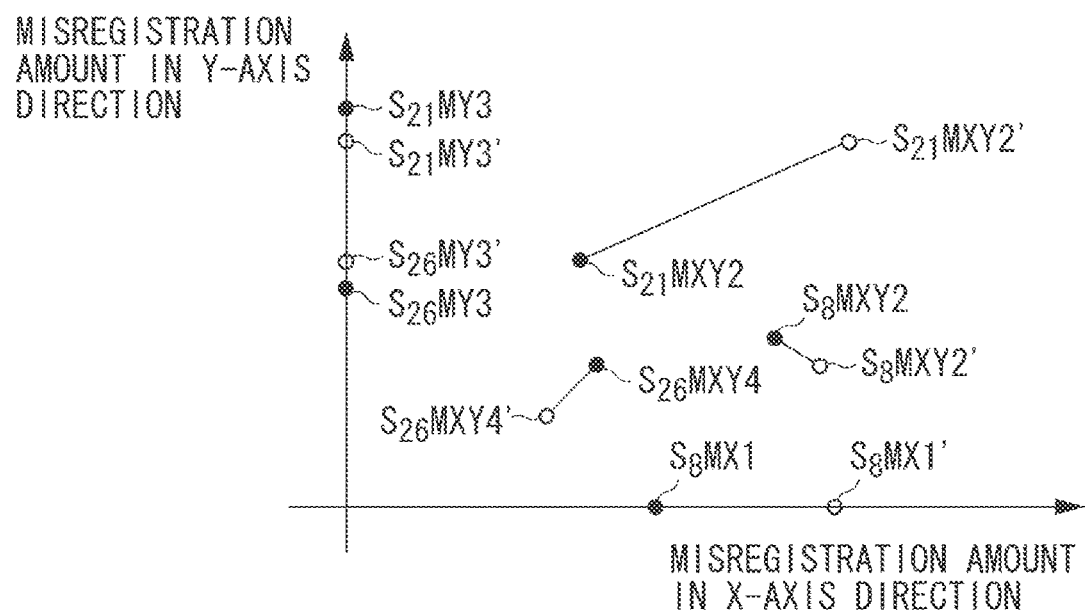
FIG. 18 is a diagram used to describe another method for identifying a mark showing a large measurement error.

Recording of the coefficients of the regression equation in the table has been described as an example. However, the positional deviation of each mark obtained by the mark detection may be recorded, and the coefficients of the regression equation may be determined based on the positional deviation if necessary. Further, in the case of recording the positional deviation of each mark, as for the algorithm for changing the sample shot region group, a target for this change (replacement) may be a shot region related to a mark showing a largest discrepancy between the positional deviation recorded in the table and a positional deviation in a target substrate. In FIG. 18, each black circle indicates the positional deviation in the table, and each white circle indicates the positional deviation in the target substrate. Here, the target for the change may be a shot region related to a mark showing a largest discrepancy (distance) in positional deviation for this mark. In the example of FIG. 18, a shot region 21 related to a mark S21MXY2 may be the target for the change.

Further, the coefficients of the regression equation (or the positional deviation of each mark) and the offset amounts recorded in the table may be obtained by an apparatus (such as a overlay inspection apparatus) present outside the lithography apparatus. Furthermore, instead of changing the sample shot region group in step S216 or step S315, other measurement condition (e.g., a wavelength of light illuminating a mark) may be changed. Moreover, the regression equation has been described above as a simple equation with respect to the coordinates of the mark, but may be a quadratic or higher equation.

Exemplary Embodiment of Article Manufacturing Method

A method of manufacturing an article according to an exemplary embodiment is suitable for, for example, manufacturing an article such as a microdevice like a semiconductor device, and an element with a fine structure. This method may include a process for forming a pattern (e.g., a latent image pattern) on an object (e.g., a substrate having a surface provided with a photosensitive material) by using the lithography apparatus. This method may further include a process (e.g., a developing process) for processing the object having the pattern formed in the process for forming the pattern. Further, this method may include other known processes (such as oxidation, film formation, vapor deposition, doping, planarization, etching, resist separation, dicing, bonding, and packaging). The method of manufacturing the article according to the present exemplary embodiment is more advantageous than a conventional method, in at least one of performance, quality, productivity, and production cost of the article.

Other Exemplary Embodiments

Embodiments of the present disclosure may also be realized by performing the following processing. A program (software), which is provided to realize the functions of one or more of the above-described exemplary embodiments, is supplied to the system or apparatus through a network or a storage medium. The program is read out and executed by a computer, a CPU, or a micro processing unit (MPU) of a system or apparatus.

While the present disclosure has been described with reference to the exemplary embodiments, the disclosure is not limited to those exemplary embodiments, and may be variously altered or modified within the scope of the gist thereof. For example, in the above-described exemplary embodiments, the exposure apparatus using the ultraviolet light, vacuum-ultraviolet light, or extreme ultraviolet light has been described as an example of the lithography apparatus. However, the lithography apparatus is not limited thereto and may be, for example, a rendering apparatus that performs rendering on a substrate (a photosensitive material thereon) with a charged particle beam such as an electron beam. Further, the lithography apparatus may be a print apparatus that forms a pattern on a substrate by shaping (molding) an imprint material on the substrate, using a mold. Furthermore, the measuring apparatus according to an embodiment of the present disclosure is also applicable to various device manufacturing apparatuses, various processing apparatuses, and various measuring apparatuses other than the lithography apparatus, as long as it is to measure the position of each shot region formed on a substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of priority from Japanese Patent Application No. 2013-227241 filed Oct. 31, 2013, which is hereby incorporated by reference herein in its entirety.

What is claimed is:

1. A measuring apparatus for measuring a position of each of a plurality of shot regions formed on a substrate, the apparatus comprising:
   a detector configured to detect a mark formed with respect to a shot region on the substrate; and
   a processor configured to obtain a position of each of the plurality of shot regions based on an output of the detector,
   wherein the processor is configured to obtain a coefficient of a regression equation for obtaining a position of each of the plurality of shot regions, based on an output of the detector with respect to each of a plurality of sample shot regions on the substrate, and obtain, if the coefficient satisfies a tolerable condition for a discrepancy between the coefficient and a reference value thereof, the position of each of the plurality of shot regions using each offset amount that is obtained beforehand to correct the position of each of the shot regions obtained based on the regression equation.

2. The apparatus according to claim 1, wherein the processor is configured to perform, if the coefficient does not satisfy the tolerable condition, processing for obtaining the coefficient, based on an output of the detector with respect to each of sample shot regions that are different from the plurality of sample shot regions.

3. The apparatus according to claim 2, wherein the processor is configured to set the different sample shot regions by replacing a sample shot region, with respect to which a positional deviation of a mark obtained based on an output of the detector does not satisfy a tolerable condition, with another shot region.

4. The apparatus according to claim 2, wherein the processor is configured to repeat the processing until the tolerable condition is satisfied by the coefficient or a predetermined termination condition is satisfied.

5. The apparatus according to claim 4, wherein the processor is configured to output information indicating that the termination condition is satisfied while the tolerable condition has not been satisfied.

6. The apparatus according to claim 1, wherein the tolerable condition is that an absolute value of the discrepancy between the coefficient and the reference value is within a tolerance range.

7. The apparatus according to claim 6, wherein the processor is configured to obtain the tolerance range based on a coefficient of the regression equation obtained beforehand and a set value.

8. The apparatus according to claim 6, wherein the processor is configured to obtain the tolerance range based on frequency distribution of a coefficient of the regression equation obtained beforehand.

9. A lithography apparatus forming a pattern on a substrate, the apparatus comprising:
a measuring apparatus, defined in claim 1, for measuring a position of each of the plurality of shot regions formed on the substrate; and
a positioning device configured to position the substrate based on the position of each of the plurality of shot regions measured by the measuring apparatus.

10. A method of measuring a position of each of a plurality of shot regions formed on a substrate, the method comprising steps of:
obtaining a coefficient of a regression equation for obtaining a position of each of the plurality of shot regions, by detecting a mark formed with respect to each of a plurality of sample shot regions on the substrate; and
obtaining, if the coefficient satisfies a tolerable condition for a discrepancy between the coefficient and a reference value thereof, the position of each of the plurality of shot regions using each offset amount that is obtained beforehand to correct the position of each of the plurality of shot regions obtained based on the regression equation.

11. A method of manufacturing an article, the method comprising steps of:
forming a pattern on a substrate using a lithography apparatus; and
processing the substrate, on which the pattern has been formed, to manufacture the article,
wherein the lithography apparatus includes
a measuring apparatus for measuring a position of each of a plurality of shot regions formed on the substrate, and
a positioning device configured to position the substrate based on the position of each of the plurality of shot regions measured by the measuring apparatus,
wherein the measuring apparatus includes:
a detector configured to detect a mark formed with respect to a shot region on the substrate; and
a processor configured to obtain a position of each of the plurality of shot regions based on an output of the detector,
wherein the processor is configured to obtain a coefficient of a regression equation for obtaining a position of each of the plurality of shot regions, based on an output of the detector with respect to each of a plurality of sample shot regions on the substrate, and obtain, if the coefficient satisfies a tolerable condition for a discrepancy between the coefficient and a reference value thereof, the position of each of the plurality of shot regions using each offset amount that is obtained beforehand to correct the position of each of the plurality of shot regions obtained based on the regression equation.

12. A measuring apparatus for measuring a position of each shot region formed on a substrate, the apparatus comprising:
a detector configured to detect a mark formed with respect to a shot region on the substrate; and
a processor configured to obtain the position of each shot region based on an output of the detector,
wherein the processor is configured to obtain a coefficient of a regression equation for obtaining the position of each shot region, based on an output of the detector with respect to each of a plurality of shot regions, as a part of all shot regions, on the substrate, and perform, if the coefficient does not satisfy a tolerable condition for a discrepancy between the coefficient and a reference value thereof, processing for reobtaining the coefficient, based on an output of the detector with respect to each of shot regions, as a part of the all shot regions, that are different from the plurality of shot regions, so as to obtain the position of each shot region using an offset amount, corresponding thereto, that is obtained beforehand to correct a position of the each shot region obtained based on the regression equation with the reobtained coefficient that satisfies the tolerable condition.

13. A lithography apparatus forming a pattern on a substrate, the apparatus comprising:
a measuring apparatus, defined in claim 12, for measuring a position of each shot region formed on the substrate; and
a positioning device configured to position the substrate based on the position of each shot region measured by the measuring apparatus.

14. A method of manufacturing an article, the method comprising steps of:
forming a pattern on a substrate using a lithography apparatus defined in claim 13; and
processing the substrate, on which the pattern has been formed, to manufacture the article.

15. A method of measuring a position of each shot region formed on a substrate, the method comprising steps of:
obtaining a coefficient of a regression equation for obtaining the position of each shot region, by detecting a mark formed with respect to each of a plurality of shot regions, as a part of all shot regions, on the substrate; and
performing, if the coefficient does not satisfy a tolerable condition for a discrepancy between the coefficient and a reference value thereof, processing for reobtaining the coefficient, based on an output of the detector with respect to each of shot regions, as a part of the all shot regions, that are different from the plurality of shot regions, so as to obtain the position of each shot region using an offset amount, corresponding thereto, that is obtained beforehand to correct a position of the each shot region obtained based on the regression equation with the reobtained coefficient that satisfies the tolerable condition.

* * * * *